(12) United States Patent
You

(10) Patent No.: US 6,403,409 B1
(45) Date of Patent: Jun. 11, 2002

(54) METHOD FOR FABRICATING TOP GATE TYPE POLYCRYSTALLINE SILICON THIN FILM TRANSISTOR

(75) Inventor: Chun-Gi You, Yongin-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/651,258

(22) Filed: Aug. 30, 2000

(30) Foreign Application Priority Data

Aug. 30, 1999 (KR) ............................................ 99-36205
Aug. 30, 1999 (KR) ............................................ 99-36209

(51) Int. Cl.[7] .......................... H01L 21/00; H01L 21/84
(52) U.S. Cl. ....................... 438/164; 438/151; 438/154
(58) Field of Search ......................... 438/30, 162, 155, 438/151, 154, 164

(56) References Cited

U.S. PATENT DOCUMENTS 5,668,019 A * 9/1997 Kobayashi et al. ......... 438/163
6,271,900 B1 * 8/2000 Li ................................. 349/95
6,225,150 B1 * 5/2001 Lee et al. .................... 438/153

* cited by examiner

Primary Examiner—Michael S. Lebentritt
Assistant Examiner—Beth E. Owens
(74) Attorney, Agent, or Firm—McGuireWoods LLP

(57) ABSTRACT

A method for forming a top gate polysilicon type thin film transistor is disclosed. Prior to ion implantation, a gate insulating layer except for a gate region is removed to lower an energy level for ion implantation. When two impurity types of a transistor are made on the same substrate, low energy ions are implanted to diminish a photoresist burning problem. Therefore, it is possible to improve conductivity of polysilicon and alleviate damage to the polysilicon.

25 Claims, 16 Drawing Sheets

METHOD FOR FABRICATING TOP GATE TYPE POLYCRYSTALLINE SILICON THIN FILM TRANSISTOR

FIELD OF THE INVENTION

The present invention is related to a thin film transistor and, more particularly, to a method for fabricating a top gate polysilicon type thin film transistor that can prevent a photoresist layer from burning.

BACKGROUND OF THE INVENTION

A thin film transistor liquid crystal display (hereinafter referred to as "TFT-LCD") is an LCD having a TFT used for controlling the electric potential of a pixel electrode formed in all pixels of the LCD. The TFT is formed on a glass substrate using a semiconductor thin film such as silicon. Depending on the type of a silicon thin film, the TFT is generally classified into an amorphous silicon type and a polycrystalline silicon (polysilicon) type.

The amorphous silicon type TFT can be formed using a chemical vapor deposition (CVD) process at a temperature of 400° C. or less, which does not affect a glass substrate of an LCD panel. Having relatively low mobility of a charge carrier, the amorphous silicon type is not appropriate for a transistor used in a driver circuit that requires high operation speed for an active image and a good quality LCD. Therefore, in an amorphous silicon type TFT-LCD, a driver of the LCD panel is fabricated separately from the LCD panel and then attached to a peripheral region of the LCD panel. This increases production costs and the number of steps for fabricating an LCD.

On the other hand, having the relatively high mobility of a charge carrier, the polysilicon type used in a driver circuit for driving pixels in the LCD panel can be formed on a peripheral region of a glass substrate for a switching transistor in the pixels. This reduces the cost and the number of steps for fabricating an LCD.

In fabricating a polysilicon type TFT-LCD, additional processes are required to form a polysilicon layer on a glass substrate. That is, a re-crystallization step (e.g., laser beam scanning on an amorphous silicon layer) is required. Both an N-channel transistor and a P-channel transistor are used in an integrated circuit for driving an LCD to increase effectiveness of the integrated circuit. In order to form the N-channel transistor and the P-channel transistor on the same polysilicon layer, the total process of forming the transistors tends to be complicated. When a region of a certain impurity type transistor is treated by etching or ion implantation, a region of the other impurity type transistor may be covered with a protection layer. A photoresist can be used as a protection layer. In a step of implanting N-type impurity ions applied to an N-channel transistor, a region for a P-channel transistor may be covered with photoresist patterns.

If high energy ions are implanted into the polysilicon layer under the protection of a photoresist pattern, the kinetic energy of the implanted ions is changed into thermal energy and temperature of an overall substrate rises. The raised temperature damages the flatness of the glass substrate. In the ion-implanting step, the photoresist is burned (i.e., its characteristics change), it is called "photoresist burning". Photoresist material changes by the photoresist burning, making it difficult to strip the photoresist pattern. This causes a particle problem and makes the LCD fabrication process more difficult.

The solubility change of photoresist in the stripper solution caused by pure heating is different from what is caused by the photoresist burning. Direct collision of high energy impurity ions against the photoresist material causes a photoresist burning problem. In order to resolve the photoresist burning problem, a few methods using an ion mask pattern made of other materials in lieu of a photoresist ion mask have been suggested. Because these methods, however, have their own problems, a method that can prevent the photoresist burning problem is required.

SUMMARY OF THE INVENTION

It is an object of the invention to provide a method for fabricating a polysilicon type thin film transistor that can prevent a photoresist burning problem.

It is another object of the invention to provide a method for fabricating a polysilicon type thin film transistor that can prevent damage to the flatness of a glass substrate in an ion-implanting process.

It is further another object of the invention to provide a method for fabricating a polysilicon type thin film transistor that can reduce crystal structure destruction in a polysilicon layer during the high energy ion implantation and an annealing process for recovering the destruction thereof.

It is yet another object of the invention to provide a method for fabricating a polysilicon type thin film transistor that can simplify a total process by saving a photolithography process.

According to the present invention, there is provided a method for fabricating a top gate type polysilicon thin film transistor characterized by a step of implanting low energy ions. According to the method, a step of forming a photoresist pattern for patterning a gate is executed on a substrate that has a polycrystalline active pattern differentiated into each transistor region, a gate insulating layer formed on the active pattern, and a gate layer formed on the gate insulating layer. The substrate can usually be made by the consequent steps of forming a polycrystalline active pattern differentiated into each transistor region on a glass substrate, forming a gate insulating layer on the glass substrate that has the polycrystalline active pattern, and forming a gate layer on the gate insulating layer.

A step of etching the gate layer and the gate insulating layer follows. Usually, the step of etching the gate layer is performed by selectively etching the gate layer using a photoresist pattern corresponding to a gate pattern. The step of etching the gate insulating layer is performed under the protection of the same photoresist pattern. Then, low energy ions are implanted to form a source/drain region of a thin film transistor. In this case, the low energy has a rather relative meaning. However, the meaning can be confined to a certain level of energy by the designed depth of a doping region (i.e., the source/drain region). Because the gate insulating layer is absent in the source/drain region of a transistor, the low energy ions can be implanted. To form the photoresist pattern, a two-grade (or two-tone) exposure method can be used for saving a photolithographic step. The exposure may be done by a photo mask having a transparent region, a semitransparent region, and an opaque region. The semitransparent region may be replaced by the opaque region having many narrow transparent slits over the whole region.

A photoresist region corresponding to the semitransparent region is exposed to light of middle intensity. The light of middle intensity decomposes a molecular structure of the photoresist only in an upper portion of the photoresist layer, so that an upper portion of the photoresist region corresponding to the semitransparent region of the photo mask is removed in the following development process. The gate layer is isotropically etched under the protection of the photoresist gate pattern. In the isotropic etching, a peripheral region of the gate layer under the photoresist pattern is cut and removed. If a gate insulating layer is anisotropically etched using the same etching mask in the following process, the width of the gate insulating pattern is greater than that of the gate pattern. If the wider part of the gate insulating pattern serves as a mask for implanting the low energy ions, an undoped region covered by the wider part may serve as a lightly doped drain (LDD) region or an offset region.

As is described above, the most characteristic part of the invention is that the high energy ion implantation that causes the photo resist burning is replaced by the low energy ion implantation. The gate insulating layer is generally removed over the source/drain region. The invention premises that the driver IC having both an N-channel and P-channel transistors is formed on the peripheral region of the glass substrate with the switching transistor in the display region. Thus, each of the N-type impurity ion implantations and P-type impurity ion implantation can be performed under another ion implanting mask. In a transistor region of each type, the LDD region can be made or may not be made depending on the need. The sequence of forming two different types of transistors can also be changed without serious problems in the invention.

The other objects, features and advantages of the present invention will become apparent from the following description taken in conjunction with the accompanying drawings.

DESCRIPTION OF THE PREFERRED EMBODIMENT

Figure 1:
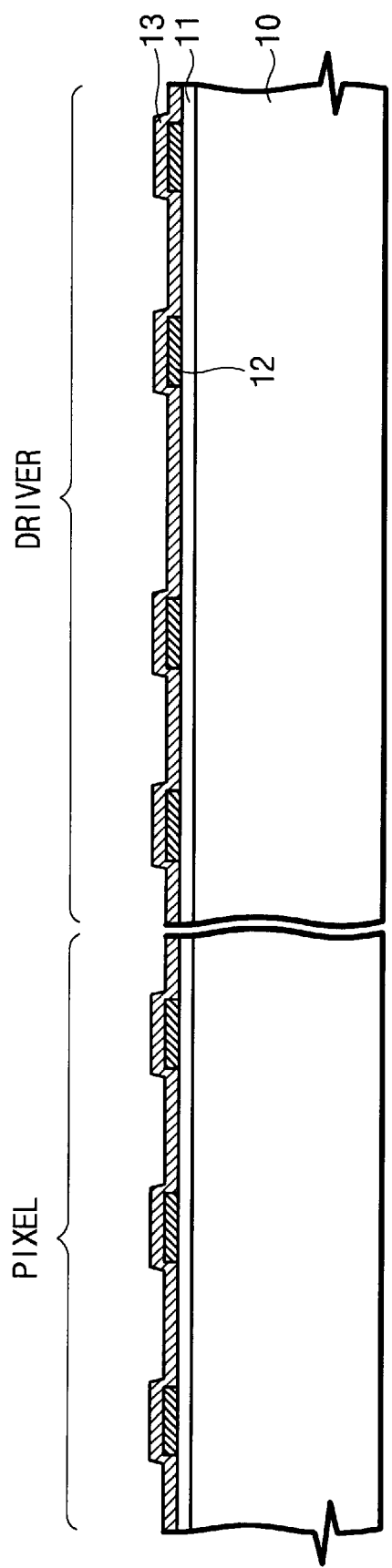
FIGS. 1–11 are cross-sectional views showing the steps of the fabricating process of one embodiment of the present invention.

The present invention will now be described hereinafter more fully with reference to the attached drawings in which the same reference numerals refer to the same elements.

Embodiment 1

Referring to FIG. 1, an insulation layer 11 of silicon dioxide with a thickness of 2000 Å is formed on a glass substrate 10. An amorphous silicon layer with a thickness of 800 Å, which is doped with N-type impurities, is formed on the insulation layer 11 and patterned to form a buffer pattern 12. On the buffer pattern 12, a polysilicon layer is formed to a thickness of 500 Å to 800 Å. The insulation layer 11 and the buffer pattern 12 may be omitted. The polysilicon layer 13 is formed by low temperature deposition of an amorphous silicon layer and the following step of re-crystallization by scanning laser beam to the amorphous silicon.

Figure 2:
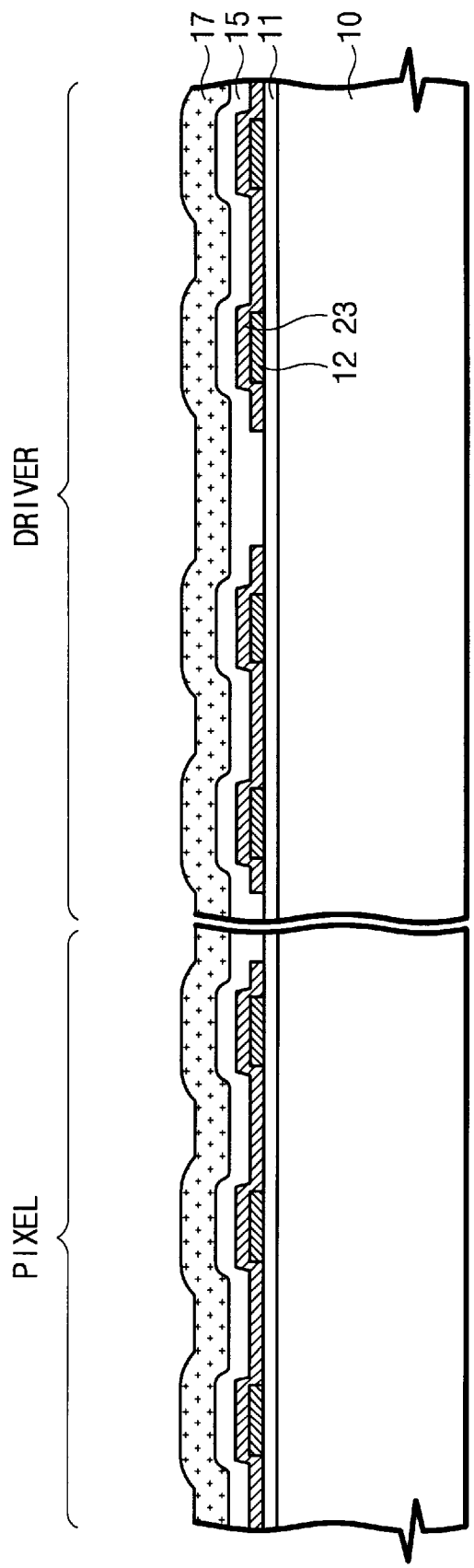

Referring to FIG. 2, a polysilicon layer 13 is patterned to form a polysilicon pattern 23, which is to be an active region of a thin film transistor. A photoresist pattern (not shown) used as an etching mask is removed, and a gate insulating layer 15 and a gate layer 17 are sequentially formed on the pattern 23. Usually, the gate layer 17 is made of aluminum neodymium alloy (AlNd) with a thickness of 2000 Å to 3000 Å, and the gate insulating layer is made of silicon dioxide with a thickness of 1000 Å. The gate layer 17 may also be formed by double layers, which are made of aluminum containing metal and molybdenum containing metal or aluminum containing metal and chromium. In this case, the layers of combination should be selected such that each metal layer complements the deficiency of the other layer.

Figure 3:
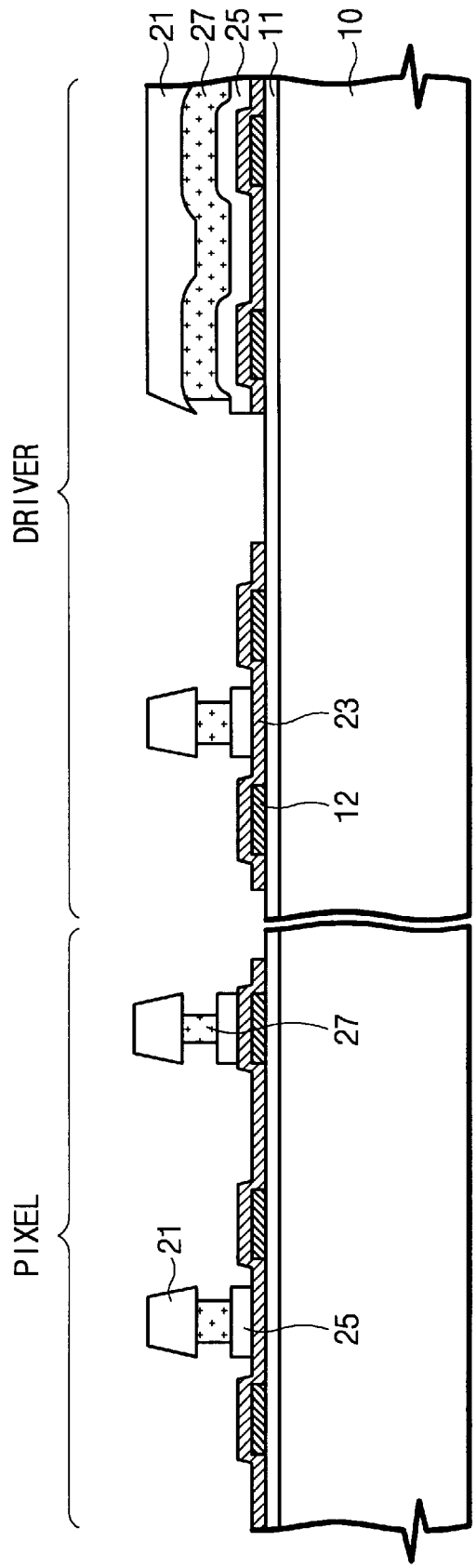

Referring to FIG. 3, the gate layer 17 (shown in FIG. 2) is patterned to form a gate pattern 27 in a region of an N-channel transistor. At this time, a region of a P-channel transistor is covered and protected by a photoresist pattern 21. In a photolithography process, a sidewall of the photoresist pattern 21 is usually formed to be inclined to the vertical line. The gate layer 17 is isotropically etched to form the gate pattern 27, so that width of the gate pattern 27 is narrower than that of a lower portion of the photoresist pattern 21. Because the width of the lower layer is smaller than that of the upper layer, the lower layer is called "undercut". The width difference between the two patterns 21 and 27 in one side (i.e., width of the undercut region) may be 0.5~1.5 micrometers. The width of the undercut region may be controlled in an etching step for forming a proper LDD region. For example, if designed that the doping concentration of impurities are to be high, the width of the undercut region shall be long. If designed that the potential difference between a gate and a source be low, the width thereof shall be short. In the following step, the gate insulating layer 15 is anisotropically etched using the same etching mask, obtaining the gate insulating pattern 25 having the same width as the photoresist pattern 21. During the etching step, the revealed polysilicon pattern 23 should be reserved. In etching the gate insulating layer 15, an etchant having a good etching selectivity for the gate insulating layer with respect to polysilicon is used to prevent the polysilicon pattern 23 being from removed. It is preferable that the selectivity between the gate insulating layer and the polysilicon layer be 1 to 10. For example, a gas mixture of Ar and $CHF_3$ may be used.

Figure 4:
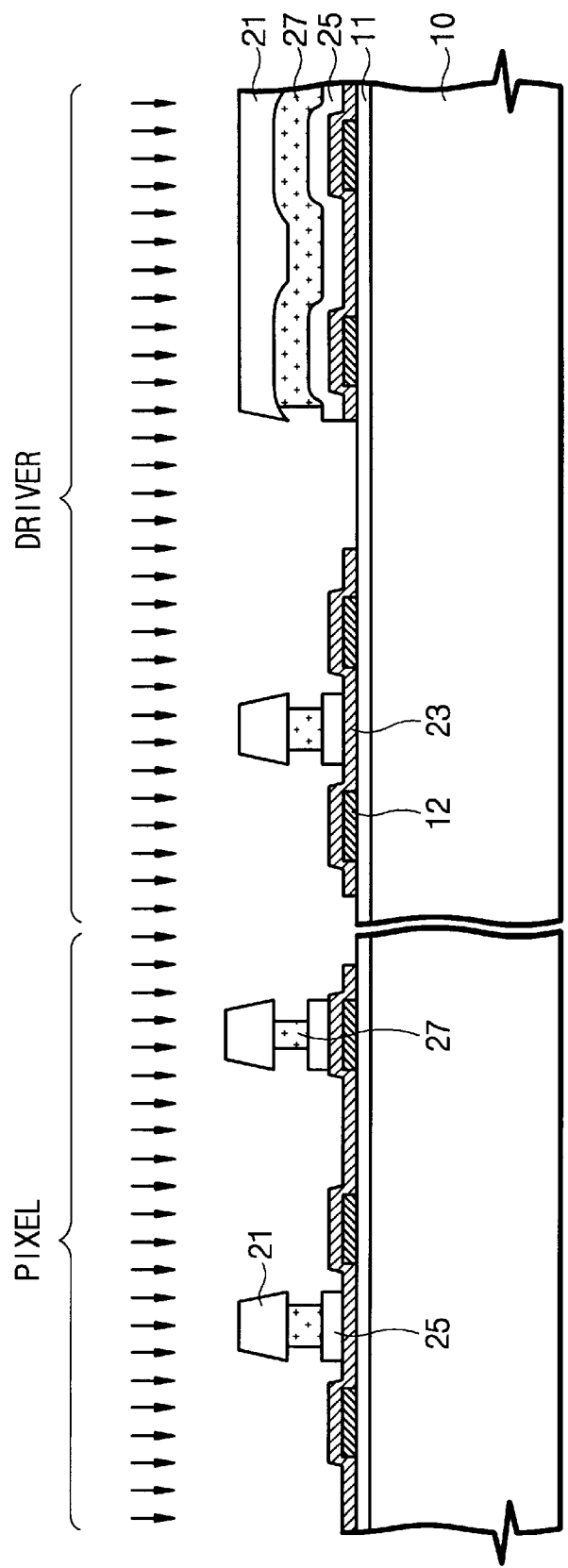

Referring to FIG. 4, N-type impurity ions of low energy are implanted onto a substrate 10 having a gate insulating pattern 25. A photoresist pattern 21 is not removed yet. $PH_3$ can be often used as N-type impurity. The ion implantation is performed with a relatively high dose of 1.0E15 to 5.0E15 ions/$cm^2$. An energy level of the implanted ions should not exceed 30 keV, and preferably be 20 keV. Considering that a general energy level of ion implantation is about 90 keV, the decrease in the energy level is prominent. The low energy ion implantation is possible because the gate insulating layer 15, which requires a large amount of energy to penetrate, is removed from the source/drain region. As the energy level decreases, heat generated during the ion implantation process decreases. Further, property changes or chemical reactions of photoresist material are diminished to avoid a hardening problem such as photoresist burning. The energy level of the implanted ions is decreased to alleviate the impact of collision and destruction of the structure (damage to the crystal structure) in polysilicon. The alleviation of the damage can omit or shorten the annealing process. Because annealing is a thermal step, the omission of annealing can prevent the problems that may occur during the thermal step.

Figure 5:
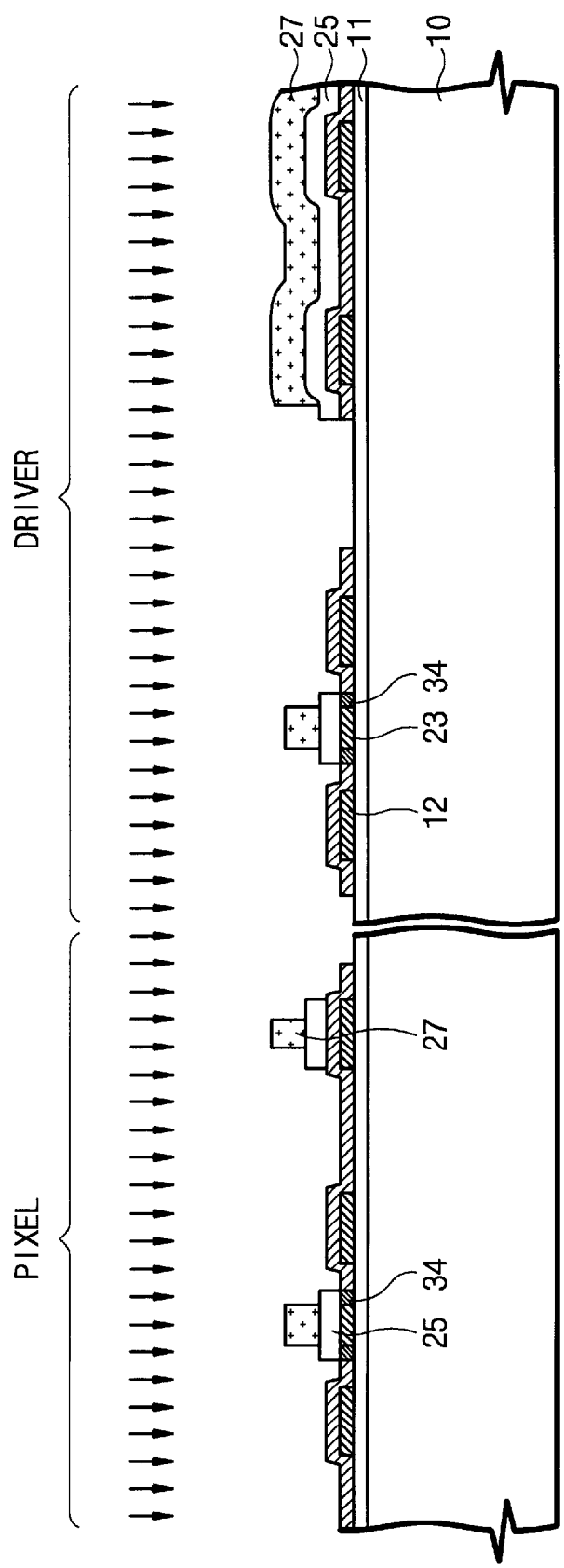

Referring to FIG. 5, after high dose, low energy ions are implanted, the photoresist pattern is removed and low dose, high energy N-type impurity ions are implanted. At this time, the high energy impurity ions penetrate gate insulating layer 25 below an undercut region. Because the residual photoresist pattern 21 has been removed, the photoresist burning is not a problem. Finally, the source/drain structure having an LDD region 34 is formed. The dosage of ion implantation is 1.0E12 to 8.0E12 ions/cm$^2$. The dosage level corresponds to 0.1% of the dosage level of the low energy ion implantation, and the energy level is about 90 keV. Because the dosage of ion implantation is low, any additional effect on the source/drain region is negligible. Because the dosage level is low, the amount of heat generated by the high energy ions is also negligible.

According to this embodiment, all the N-channel transistors have an LDD region 34 regardless of a display region and a driver circuit region. But, an LDD structure may be formed only for the N-channel transistors in the driver region. Of course, some additional processes may be required then. The LDD structure can also be formed for a P-channel transistor. The LDD region can be replaced by an offset region where ion implantation is not made.

Figure 6:
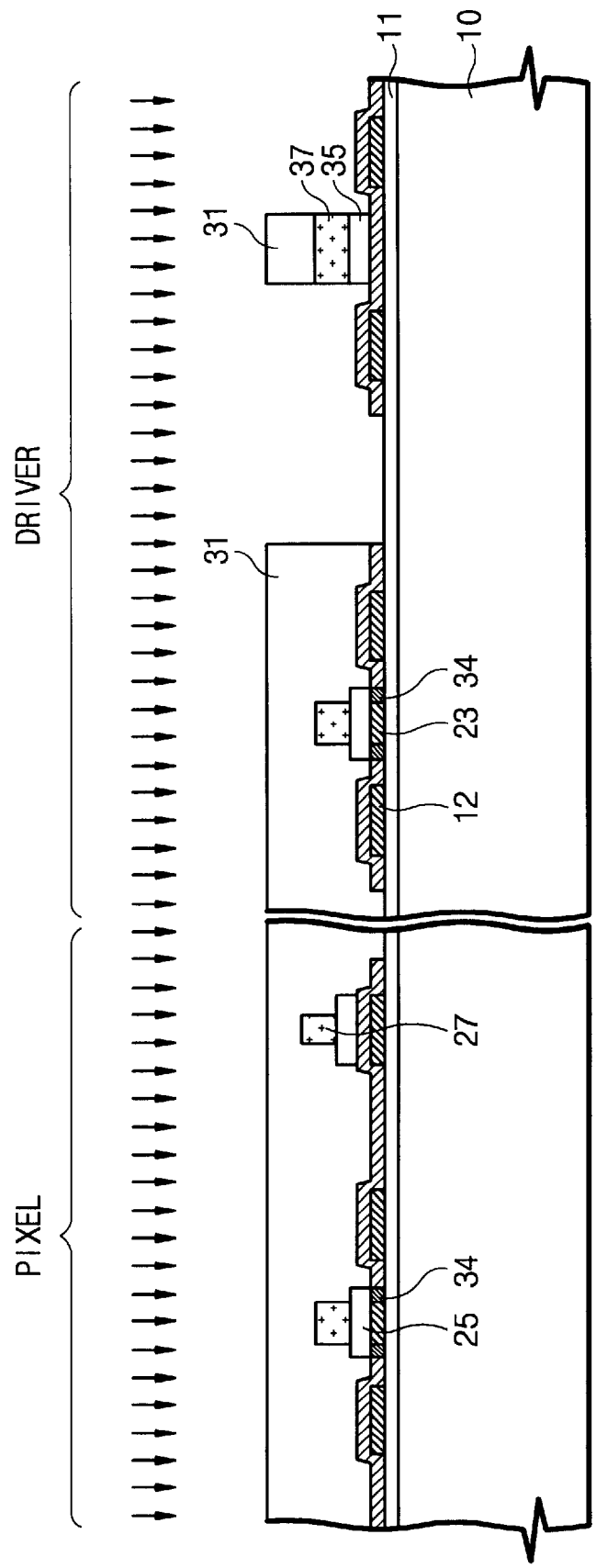

Referring to FIG. 6, a photo resist pattern 31 is formed on a substrate 10 after the high energy ion implantation. At this time, in a P-channel transistor region of a driver integrated circuit, the photoresist pattern 31 corresponding to a gate pattern is formed. In an N-channel transistor region of the driver integrated circuit and a pixel, the photoresist pattern 31 covers the whole part. A gate layer is etched to form gate pattern 37 and consequently the gate insulating layer is etched to form gate insulating pattern 35 in the P-channel transistor region. Then, P-type low energy ions are implanted. Because an LDD structure is not required in the P-channel transistor, the gate pattern 31 is anisotropically etched. Dosage and energy level of the P-type ion implantation are decided in relation to dosage and energy level of the N-type low energy ion implantation. $B_2H_6$ is generally used as P-type impurity source. This embodiment can change the sequence of forming an N-type transistor and a P-type transistor.

Figure 7:
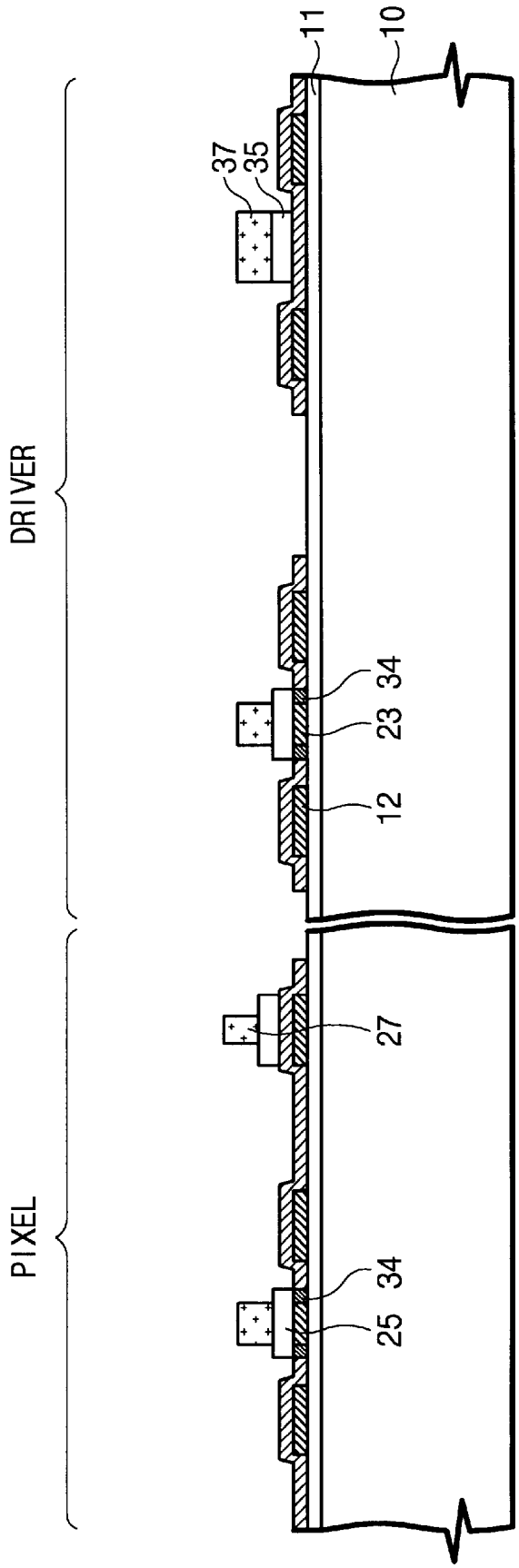

With regard to FIG. 7, the whole photoresist pattern is removed from a substrate after implanting P-type low energy ions. As the photoresist is not burned hard, the photoresist can be stripped without difficulties. Usually, laser beam scanning or heating is followed for annealing the polysilicon pattern 23. It is annealed to compensate for the damage in a crystal structure of the polysilicon pattern 23 and to activate the diffusion of the implanted impurities. The annealing can be done at a lower intensity in a shorter time period because the ion implantation is done with a low energy level.

Figure 8:
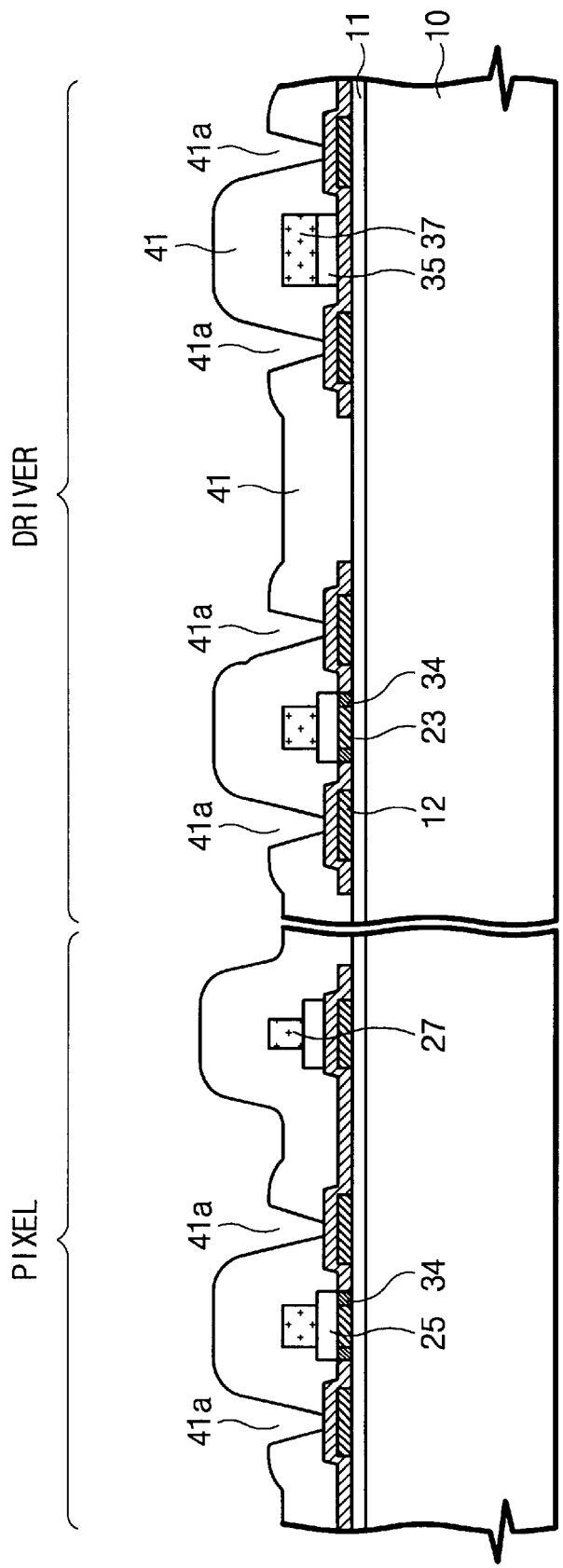

Regarding FIG. 8, an interlayer insulating film 41 is formed after annealing. Polysilicon is annealed after the interlayer insulating film 41 is formed rather than before its formation. The interlayer insulating film 41 is generally made of silicon oxide or silicon nitride to a thickness of 6000 Å to 8000 Å. Then, contact holes 41 a are formed on a source/drain region of a polysilicon pattern.

Figure 9:
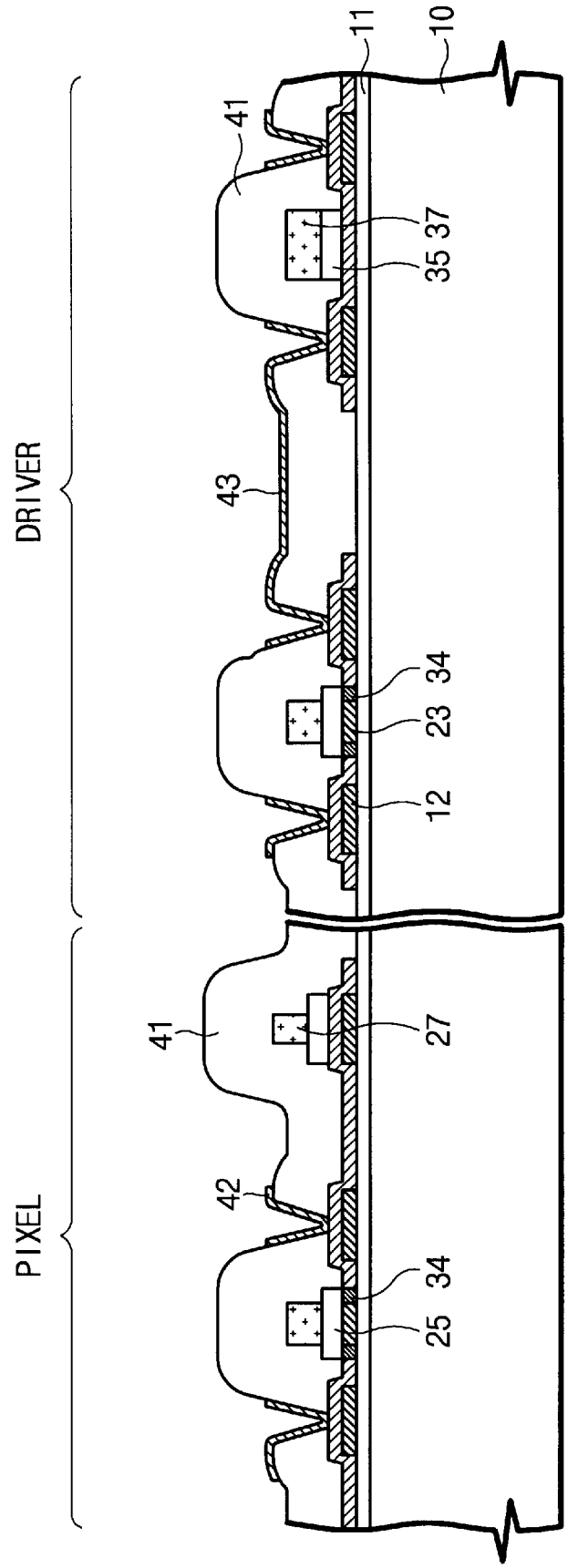

Referring to FIG. 9, a metal layer is formed on a substrate 10 having an interlayer insulating film 41 and contact holes 41a. Then, the metal layer is patterned to form a contact electrode 42 and a conduction line 43. The metal layer is made of one selected from the group consisting of molybdenum tungsten (MoW), aluminum neodymium, chromium, tantalum, titanium, and the combinations thereof. Before forming the metal layer, insulating materials (e.g., silicon oxide) may exist on a surface of a revealed part of the polysilicon pattern. The insulation materials increase contact resistance and decrease a practically applied potential level, causing functional degradation of a transistor. Accordingly, the insulating materials should be removed. In a cleaning process for removing the insulating materials, both preparation for cleaning organic insulating material and for cleaning oxide material are required. For example, a plasma cleaning process using HF or a gas mixture of oxygen and $CF_4$ can be done for removing the oxide materials. And, for removing the organic insulating materials, a plasma cleaning process using argon gas can be done.

In addition, a surface of a polysilicon pattern is thermally treated at a temperature of 350° C. to 450° C. to improve the electrical connection of the interface after forming the metal layer.

Figure 10:
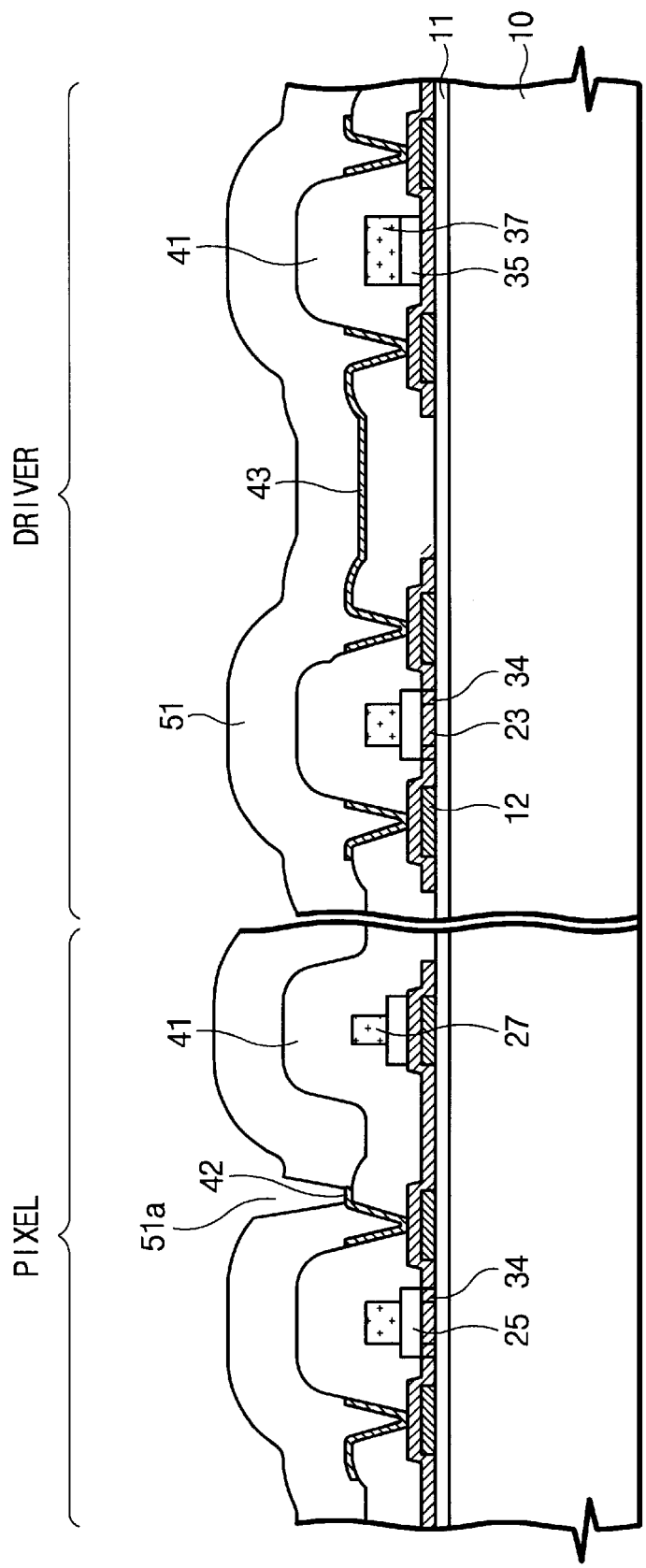

Referring to FIG. 10, a passivation layer 51 is made on the substrate having contact electrode 42 and conduction line 43, and a contact hole 51a is made in the passivation layer 51. Both organic and non-organic materials can be utilized as the passivation layer 51. When using the organic passivation layer, photosensitive organic material is favorable because a contact hole can be patterned only by exposure and development without etching. The organic passivation layer is formed thick, which is useful for surface planarization. In a reflection type LCD, a thick and photosensitive organic layer is suitable for forming a micro optic lens to improve reflection efficiency. Here, the micro optic lens is formed on the surface of the passivation layer with a shape of partial prominence and depression which cause interference of light reflected in the reflection type LCD.

Figure 11:
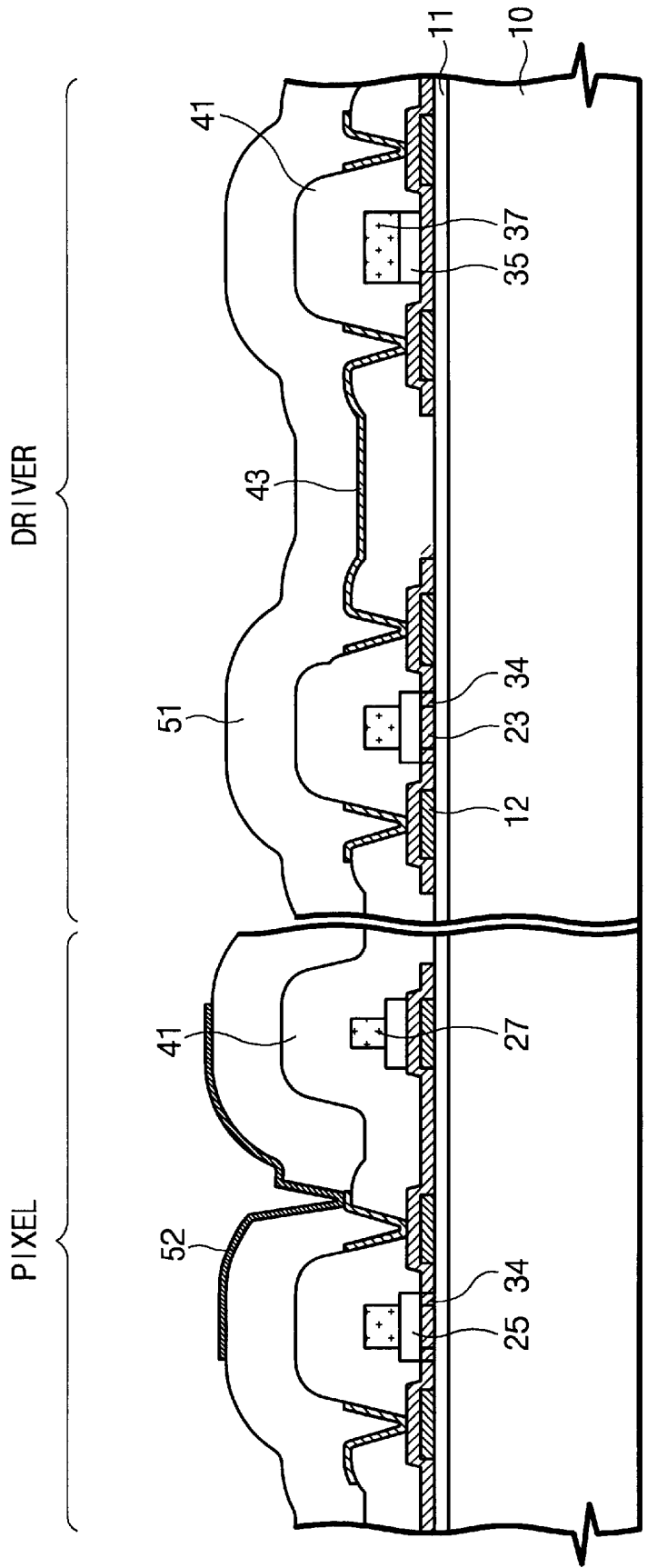

Referring to FIG. 11, a reflection layer composed of metal or a conductive transparent layer is laid on a substrate 10 having a passivation layer 51 and a contact hole 51a. Then, a patterning step for forming a pixel electrode 52 is performed. In case of a transparent type LCD, pixel electrode materials need good transparency and indium tin oxide (ITO) and indium zinc oxide (IZO) are generally used.

Figure 12:
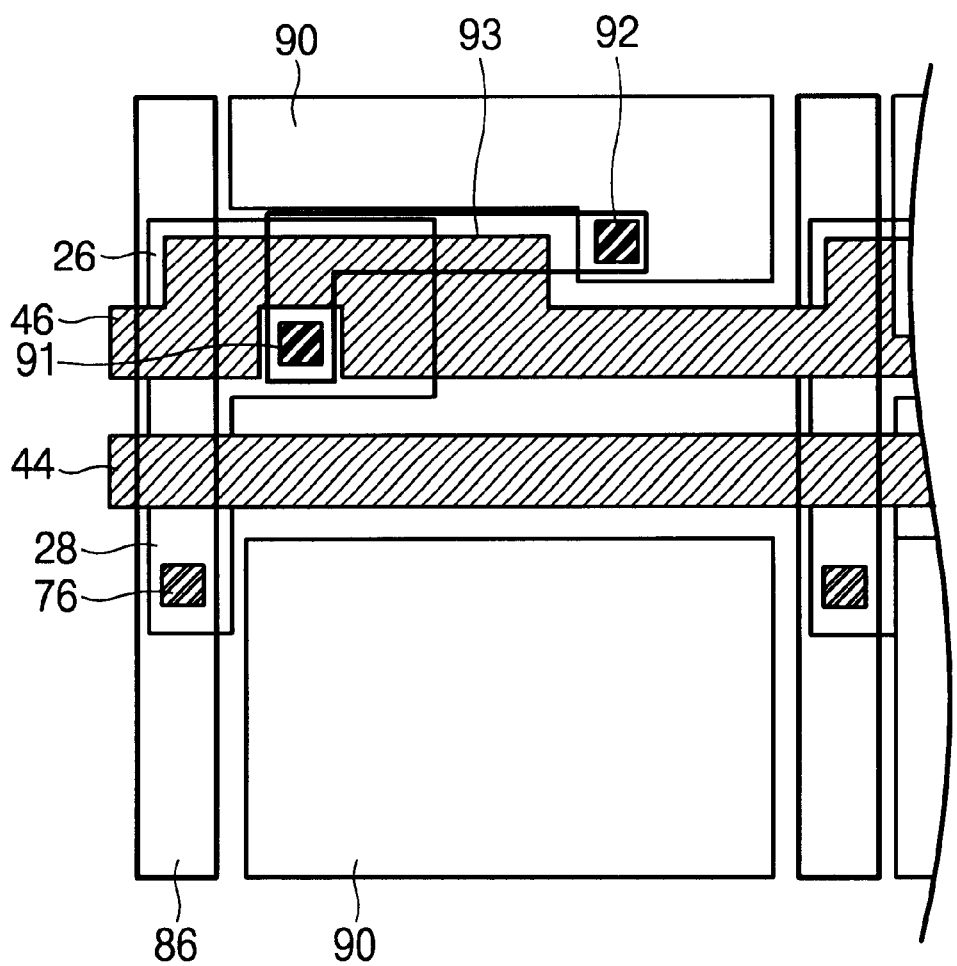
FIG. 12 is a top plan view showing a structure of a pixel of a top gate polysilicon thin film transistor LCD formed by the process presented by FIGS. 1–11.

Referring to FIG. 12, a layout presenting a TFT formed in a pixel of an LCD is shown. An LDD region is not shown in the figure. A source region 28 is connected to a data line 86 through a contact electrode 76 in an interlayer insulating film. The drain region 26 is connected to a drain contact electrode 91 and finally connected to a pixel electrode 90 by way of a connection plate 93 and an upper contact electrode 92. A gate insulating pattern is formed only under a gate pattern including a gate line 44 and a capacitor line 46.

Embodiment 2

Figure 13:
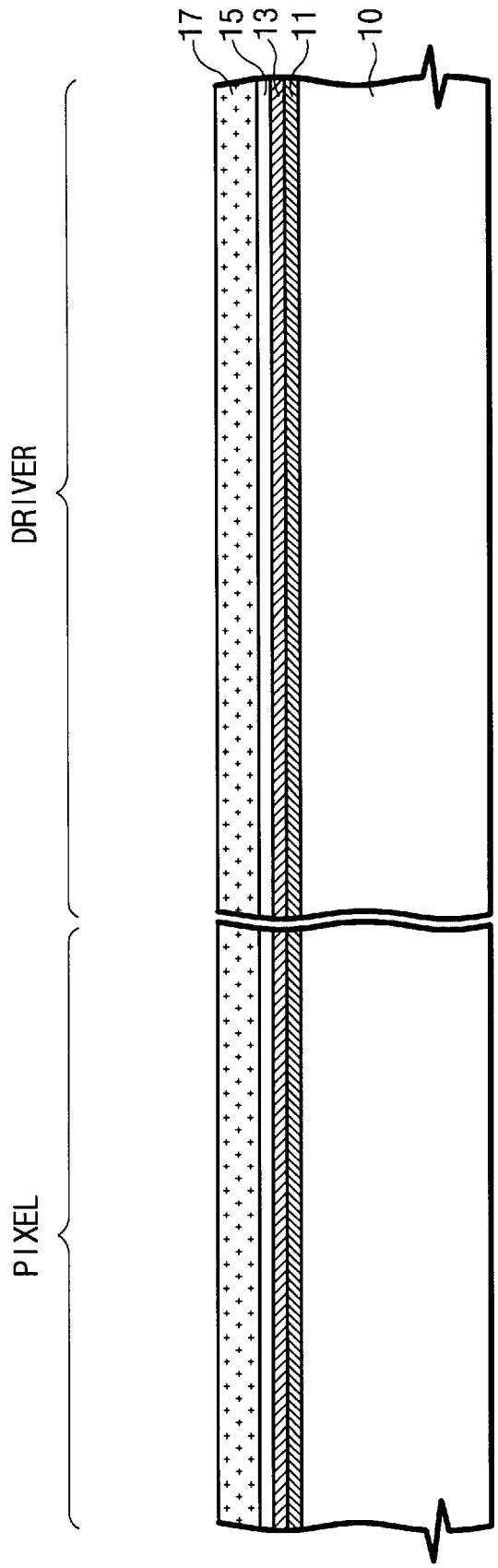
FIGS. 13–15 are cross-sectional views showing the steps of the fabricating process of another embodiment of the present invention, which are different from the embodiment presented in FIGS. 1–11.
Figure 14:
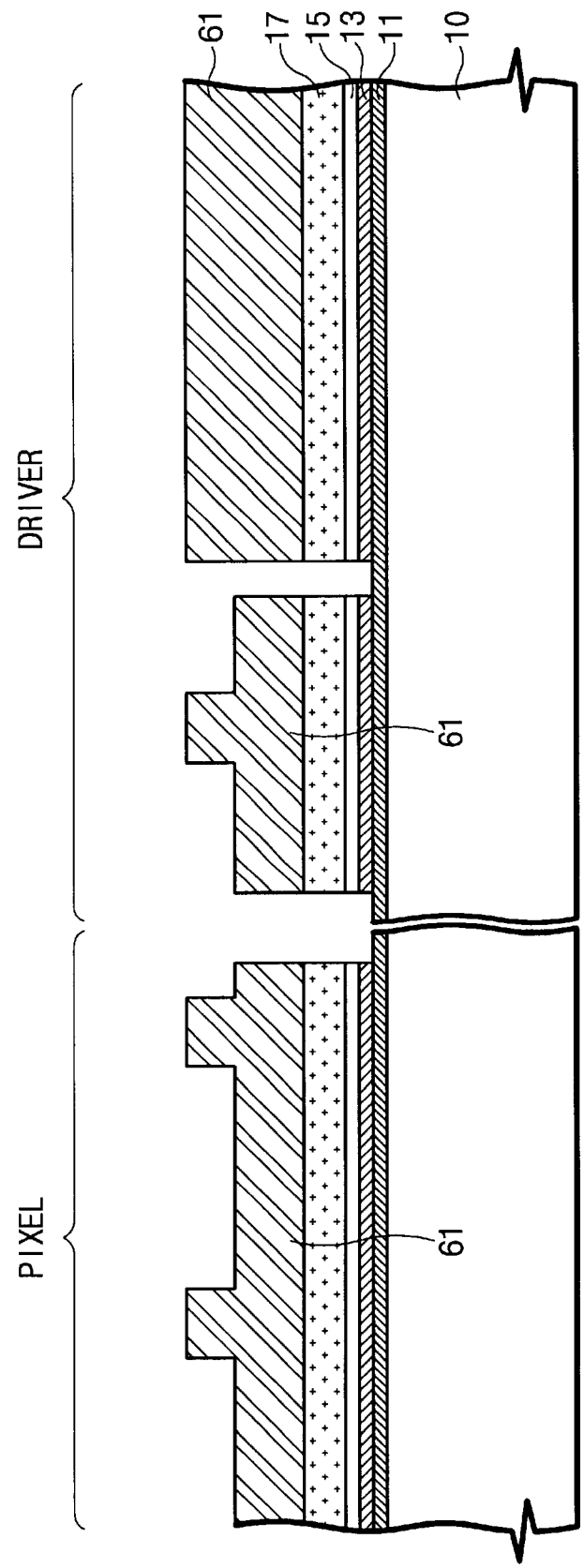
Figure 15:
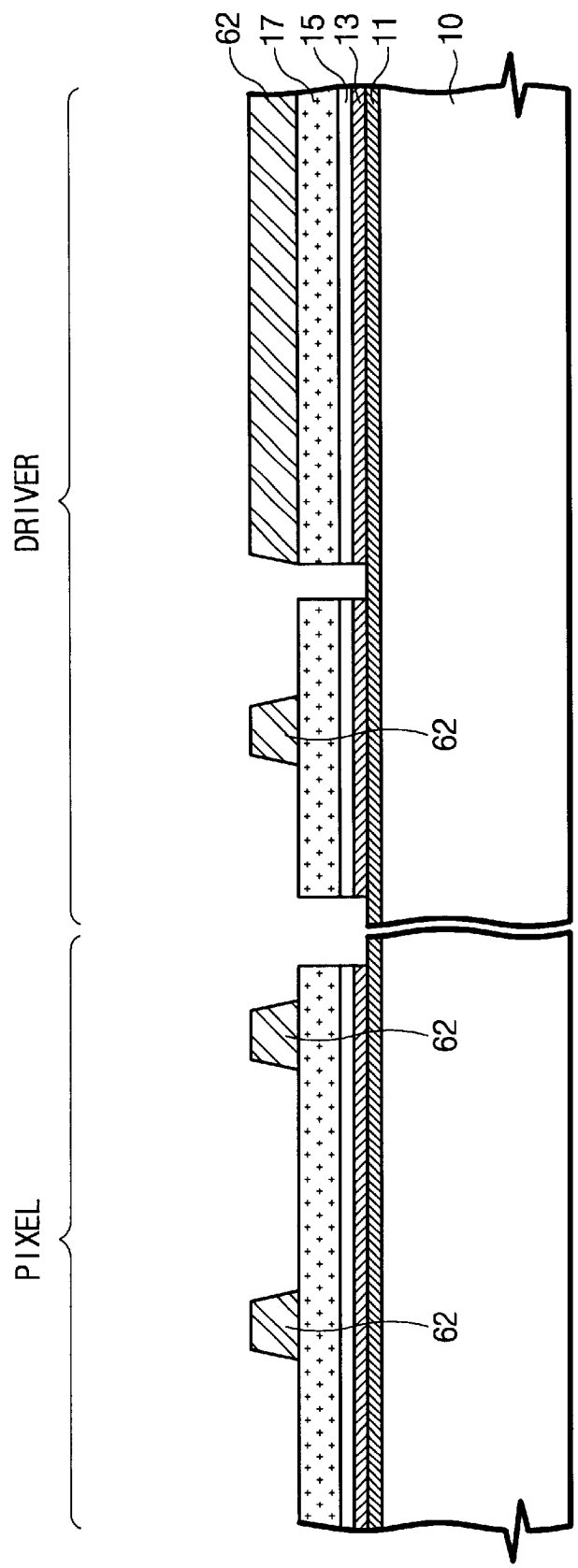

FIGS. 13–15 show initial steps in the process of another embodiment of the invention. These figures only show the difference that is not disclosed in the "Embodiment 1" described in FIGS. 1–11.

Referring to FIG. 13, an insulation layer 11 made of silicon dioxide is formed on a glass substrate 10. A polysilicon layer 13, a gate insulating layer 15, and a gate layer 17 are sequentially formed on the insulation layer 11. The insulation layer 11 can be omitted. A polysilicon layer 13 is formed by recrystallizing the amorphous silicon by laser beam scanning after layering amorphous silicon on the substrate 10.

Referring to FIG. 14, a photoresist layer is coated on the substrate 10 having the gate layer 17. Two-grade (or two-tone) photo exposure is executed on the photoresist layer, thereby forming a photoresist pattern 61 in each region of an N-channel transistor. In this case, the a photoresist pattern 61 is thick in a gate pattern part, and is thin in other active regions. In a region of a P-channel transistor, the whole part is covered with the thick photoresist pattern 61. In the other region between the transistor regions or pixels, the photoresist layer is entirely removed to differentiate each active region of a transistor or pixel region. An etching step follows. In a region uncovered with the photoresist pattern 61, a gate layer 17, a gate insulating layer 15, and a polycrystalline layer 13 are removed. One of the important difference between "Embodiment 1" and "Embodiment 2" is that the gate line does not form a line made of one conductive layer, which can clearly be shown in the following FIG. 16.

As mentioned above, two tone photo exposure can be executed by a photo mask having a transparent region, semitransparent region, and an opaque region. The semitransparent region may be replaced with an opaque region having many narrow transparent slits over the opaque region. In a positive type photoresist, a region corresponding to a semitransparent part of a photo mask is exposed to light of middle intensity. Then, an upper part of the region is partially decomposed. The decomposed part of the photoresist layer is removed in developing process, and then a thin part of the photoresist pattern is formed.

Referring to FIG. 15, after forming a photoresist pattern 61 having a thick region and a thin region, the photoresist pattern 61 is anisotropically etched back until the photoresist of the thin part is exhausted. The etch-back process may be executed in an ashing chamber. The oxygen gas is supplied and the oxygen plasma is created during the ashing process. As a result, the residual photoresist pattern 62 in an N-channel transistor region becomes an etching mask for the gate pattern, and the residual photoresist pattern 62 in a P-channel transistor region becomes a protection layer for etching. If the gate layer is etched using the residual photoresist pattern 62 as an etching mask, the result must be FIG. 3 of "Embodiment 1". The remaining process can proceed similarly to that of "Embodiment 1". "Embodiment 2" can also be characterized by the fact that the buffer layer is not used.

In a process including forming a buffer layer, by the same process as used in "Embodiment 1", an N-channel and a P-channel transistors are made and an interlayer insulating film is formed. A contact hole is formed in the interlayer insulating film. Prior to forming a contact electrode, a revealed surface of a polysilicon pattern is cleaned to remove insulating materials such as oxide or organics. In a cleaning process, however, some of the polysilicon layer is damaged. As the polysilicon layer is very thin (e.g., 500 Å or 600 Å), the damage to the polysilicon layer may be that the silicon layer at a revealed spot is totally removed. Thus, an area of electric connection between the polysilicon layer and the contact electrode decreases and the contact resistance increases. The contact electrode can be connected through the damaged polysilicon layer with a buffer pattern. Here, the buffer pattern under the polysilicon layer compensates the removed polysilicon layer and prevents the increase of contact resistance. As a result, the buffer pattern can improve the transistor reliability.

In "Embodiment 2", the buffer pattern can be omitted. Because the gate insulating layer is generally removed from the source/drain region in the present invention, the initially implanted impurities can entirely be injected into the polysilicon layer. Thus, the doping concentration of polysilicon increases and the contact resistance decreases, obtaining the same reliability of electrical connection without the buffer pattern. A step of forming the buffer pattern is skipped to simplify the total process of fabricating an LCD.

Figure 16:
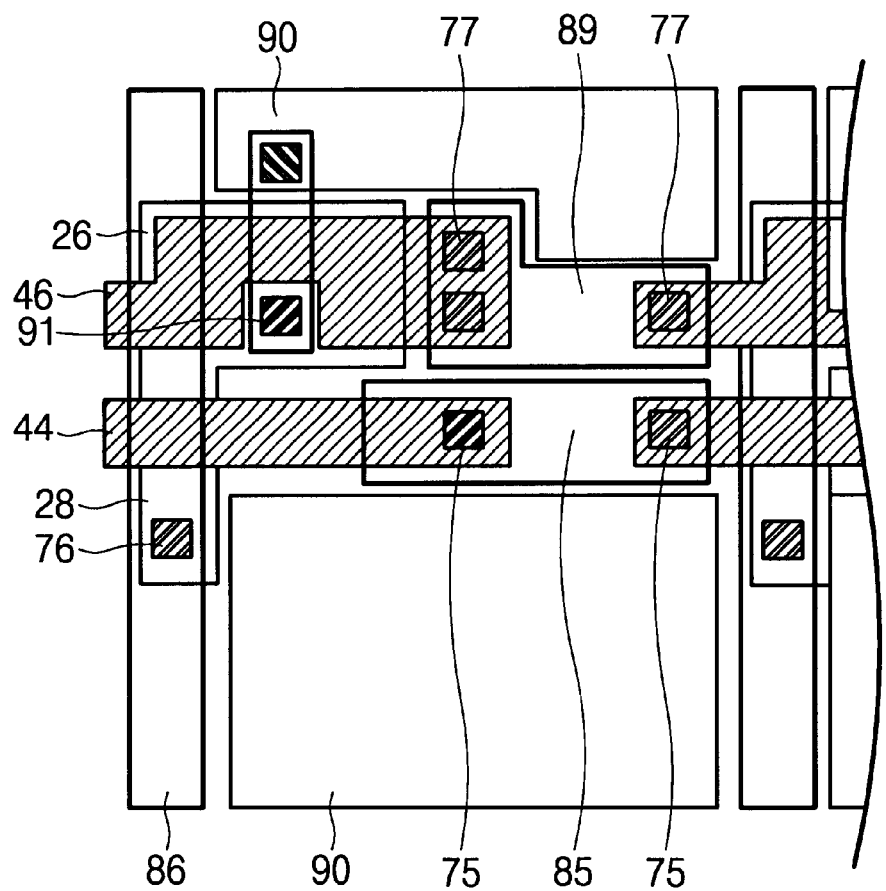
FIG. 16 is a top plan view or layout showing a structure of a pixel of top gate polysilicon thin film transistor LCD formed by the process presented by FIGS. 13–15 and by the process similar to the process of FIGS. 3–11.

As shown in the FIG. 16, the gate pattern is divided by a unit pixel. Otherwise, by the polysilicon layer under the gate line, leakage current may flow. To connect the divided gate patterns, a contact hole for connecting the gate pattern is formed and a connection plate is formed in a process of forming a data line. In the capacitor line, similar explanation can be applied. In FIG. 16, an upper gate layer pattern shows a storage capacitor 46 of the pixel and a lower gate layer pattern shows gate 44 of the N-channel pixel transistor. Under the gate layer pattern, a gate insulating layer and a polysilicon layer should exist. If the gate line is made by a line of a layer, the gate signal applied to one pixel has an influence upon adjacent pixels. So the gate layer pattern including the gate 44 and the capacitor 46 should be divided by the pixel and be connected by the contact electrodes 75 and 77 and connection plate 85 made in the step of forming data line 86.

In the process of fabricating a top gate polysilicon type thin film transistor, photoresist burning may be avoided or alleviated. Further, damage to the polysilicon pattern and necessity for annealing can be minimized. Most of the ions, which are projected to polysilicon in a step of implanting low energy ions, are injected and reserved in the polysilicon. This makes it possible to enhance conductivity of the polysilicon and improve reliability of the contact between the polysilicon layer and contact electrode. Therefore, it is possible to omit a pattern of amorphous silicon and simplify the total process of fabricating a thin film transistor.

What is claimed is:

1. A method for forming a top gate polycrystalline silicon type thin film transistor, comprising the steps of:
   providing a substrate having a polycrystalline silicon layer pattern corresponding to an active region on which a gate insulating layer and a metallic gate layer are sequentially formed;
   forming a photoresist pattern on the substrate;
   etching the metallic gate layer using the photoresist pattern to form a gate pattern;
   etching the gate insulating layer to form a gate insulating pattern; and
   implanting ions with a first energy level into the substrate having the gate insulating pattern and the photoresist pattern to form a source/drain region.

2. The method of claim 1, wherein the first energy level is lower than or equal to 30 keV.

3. The method of claim 1, wherein the gate layer is isotropically etched, and the gate insulating layer is anisotropically etched.

4. The method of claim 3, further comprising steps of removing the photoresist pattern and implanting ions with a second, higher energy level than the first energy level after formation of the source/drain region.

5. The method of claim 4, further comprising a step of removing the photoresist pattern between the step of etching the gate insulating layer and a second step of implanting ions after formation of the source/drain region.

6. The method of claim 1, wherein the first energy level corresponds to an energy required for penetrating polycrystalline silicon having a thickness of 300 Å to 800 Å.

7. A method of forming a top gate polycrystalline silicon type thin film transistor, comprising the steps of:
   forming a polycrystalline silicon pattern to form an active region on a substrate;
   forming a gate insulating layer on the polycrystalline silicon pattern;

forming a metallic gate layer on the gate insulating layer;

forming a photoresist pattern on the gate layer by photolithography;

etching the metallic gate layer using the photoresist pattern to form a gate pattern;

etching the gate insulating layer to form a gate insulating pattern; and implanting ions with a first energy level into the substrate having the gate insulating pattern and the photoresist pattern to form a source/drain region.

8. The method of claim 7, wherein the steps from forming the photoresist pattern to implanting ions are repeated twice, once for an N-channel transistor region and again for a P-channel thin film transistor region; and one channel-type thin film transistor region is protected by a photoresist pattern during the steps for forming the opposite channel-type thin film transistor region.

9. The method of claim 7, further comprising a step of forming a buffer pattern made of amorphous silicon before the step of forming the polysilicon pattern.

10. The method of claim 7, wherein an etchant of which selectivity for the gate insulating layer is ten (10) times more than the underlying polycrystalline silicon layer is used in the step of forming the gate insulating pattern.

11. The method of claim 10, wherein the etchant comprises a gas mixture of argon and $CHF_3$.

12. The method of claim 7, wherein the gate layer is isotropically etched, and the gate insulating layer is anisotropically etched.

13. The method of claim 12, wherein the gate pattern is narrower by 0.5 to 1.5 micrometers at a peripheral part than that of the gate insulating pattern.

14. The method of claim 7, further comprising steps of removing the photoresist pattern and implanting ions of a second, higher energy level than that of the first energy level after implanting ions with the first energy level.

15. The method of claim 14, further comprising a step of annealing the polycrystalline silicon pattern after implanting the ions with the second, higher energy level.

16. The method of claim 7, wherein the first energy level is lower than or equal to 30 keV.

17. The method of claim 7, further comprising the steps of:

forming an interlayer insulating layer having a contact hole at the source/drain region;

cleaning a surface of the polycrystalline silicon pattern to remove insulating materials throughout the contact hole;

layering and patterning a conductive layer to form a contact electrode and a conductive line;

forming a passivation layer having a contact hole revealing the contact electrode of the drain region; and layering and patterning a pixel electrode layer to form a pixel electrode connected to the contact electrode of the drain region.

18. The method of claim 17, wherein the passivation layer is made of organic material.

19. The method of claim 18, wherein a micro optic lens is formed on a surface of the passivation layer by a two-grade photo exposure process in the step of forming the passivation layer having a contact hole.

20. A method for forming a top gate polycrystalline silicon type thin film transistor, comprising the steps of:

sequentially forming a polycrystalline silicon layer, a gate insulating layer, and a gate layer on a substrate;

forming a photoresist pattern that remains thick in a gate region of an N-channel transistor and in all regions of a P-channel transistor, and remains thin in other active regions by photolithography of a two-grade photo exposure;

sequentially etching the gate layer, the gate insulating layer, and the polycrystalline silicon layer using the photoresist pattern to differentiate each transistor region;

etching back the photoresist pattern down to a thin part of the photoresist pattern to form an N-channel gate etching mask;

etching the gate layer using the N-channel gate etching mask to form a gate pattern;

etching the gate insulating layer to form a gate insulating pattern; and implanting ions with a first energy level to form a structure of a source/drain in an N-channel transistor.

21. The method of claim 20, wherein the gate layer is isotropically etched, and the gate insulating layer is anisotropically etched.

22. The method of claim 21, further comprising the steps of:

removing the N-channel gate etching mask;

forming a P-channel gate etching mask covering a gate region of a P-channel transistor and an overall region of the N-channel transistor;

etching the gate layer using the P-channel gate etching mask to form a gate pattern; and implanting ions with a second, higher energy level to form a structure of a source/drain of the P-channel transistor.

23. The method of claim 22, wherein a step of removing the N-channel gate etching mask follows by the step of implanting ions of a second, higher energy level than that of the first energy level and a low dosage to form an LDD structure in the N-channel transistor.

24. The method of claim 22, further comprising the steps of:

removing the P-channel gate etching mask;

forming an interlayer insulating film having a contact hole at the source/drain region of a transistor;

layering and patterning a conductive layer to form a contact electrode and a conductive line;

forming a passivation layer having a contact hole revealing the contact electrode of the drain region; and layering and patterning the pixel electrode layer to form a pixel electrode connected to the contact electrode of the drain region.

25. The method of claim 24, wherein the passivation layer is made of organic material.

* * * * *